(12) United States Patent
El Baraji et al.

(10) Patent No.: US 8,830,733 B2
(45) Date of Patent: Sep. 9, 2014

(54) CIRCUIT FOR GENERATING ADJUSTABLE TIMING SIGNALS FOR SENSING A SELF-REFERENCED MRAM CELL

(75) Inventors: Mourad El Baraji, Sunnyvale, CA (US); Guy Yuen, Morgan Hill, CA (US)

(73) Assignee: Crocus Technology SA, Grenoble Cedex (FR)

( * ) Notice: Subject to any disclaimer, the term of this patent is extended or adjusted under 35 U.S.C. 154(b) by 194 days.

(21) Appl. No.: 12/888,643

(22) Filed: Sep. 23, 2010

(65) Prior Publication Data

US 2011/0080773 A1      Apr. 7, 2011

(30) Foreign Application Priority Data

Oct. 5, 2009   (EP) ...................................... 09290763

(51) Int. Cl.
*G11C 11/16*        (2006.01)
(52) U.S. Cl.
USPC ....................................... 365/158; 365/189.15
(58) Field of Classification Search
CPC ............................ G11C 11/16; G11C 11/1673; G11C 11/1693; G11C 7/067
USPC .......................... 365/158, 189.15, 189.07, 209
See application file for complete search history.

(56) References Cited

U.S. PATENT DOCUMENTS

| | | | |
|---|---|---|---|
| 5,459,684 A * | 10/1995 | Nakamura et al. ............. | 365/149 |
| 2004/0001383 A1 * | 1/2004 | Garni et al. .................... | 365/209 |
| 2006/0158945 A1 | 7/2006 | Sakimura et al. | |
| 2009/0296462 A1 * | 12/2009 | Kent et al. ...................... | 365/171 |

OTHER PUBLICATIONS

IBM, "Adjustable Pulse Width Single Shot", Oct. 1965, IBM Technical Disclosure Bulletin, NN6510817.*

* cited by examiner

*Primary Examiner* — Douglas King
(74) *Attorney, Agent, or Firm* — Pearne & Gordon LLP (57) ABSTRACT

Controllable readout circuit for performing a self-referenced read operation on a memory device comprising a plurality of magnetic random access memory (MRAM) cells comprising a selecting device for selecting one of the MRAM cells, and a sense circuit for sourcing a sense current to measure the first and second resistance value; the sense circuit comprising a sample and hold circuit for performing said storing said first resistance value, and a differential amplifier circuit for performing said comparing the second resistance value to the stored first resistance value; wherein the controllable readout circuit further comprises a control circuit adapted to provide a pulse-shaped timing signal with a pulse duration controlling the duration of the first read cycle and the second read cycle. The controllable readout circuit allows for controlling the duration of the first and second read cycles after completion of the MRAM cell and readout circuit fabrication.

21 Claims, 3 Drawing Sheets

CIRCUIT FOR GENERATING ADJUSTABLE TIMING SIGNALS FOR SENSING A SELF-REFERENCED MRAM CELL

CROSS-REFERENCE TO RELATED APPLICATIONS

This application claims priority to a European provisional patent application, No. EP09290763, filed on Oct. 5, 2009. Priority to the provisional application is expressly claimed, and the disclosure of the provisional application is hereby incorporated herein by reference in its entirety.

FIELD

The present disclosure relates to magnetic memory system using self-referenced magnetic random access memory (MRAM) cells and more particularly to a circuit for controlling and sense data during a two-cycle read operation of MRAM cells.

BACKGROUND

In the simplest implementation, conventional magnetic random access memory (MRAM) cells comprise at least a magnetic tunnel junction formed of two magnetic layers separated by a thin insulating layer, where one of the layer, the so-called reference layer, is characterized by a fixed magnetization and the second layer, the so-called storage layer, is characterized by a magnetization which direction can be changed upon writing of the memory. When the respective magnetizations of the reference layers and the storage layer are antiparallel, the resistance of the magnetic tunnel junction is high ($R_{max}$), corresponding to a low logic state "0". On the other hand, when the respective magnetizations are parallel, the resistance of the magnetic tunnel junction becomes low ($R_{min}$), corresponding to a high logic state "1".

The logic state of the MRAM cell is usually read by comparing its resistance state to a reference resistance $R_{ref}$, preferably derived from a reference cell or an array of reference cells, with a reference resistance of typically $R_{ref}=(R_{min}+R_{max})/2$, combined in-between the magnetic tunnel junction resistance of the high logic state "1" and the resistance of the low logic state "0". Here, the respective resistance states of the MRAM cell and reference resistance $R_{ref}$ is typically measured simultaneously by passing two distinct sense currents within the MRAM cell and the reference cell or an array of reference cells. The two sense currents are then compared in order to determine the logic state of the MRAM cell.

US Patent Application No. 2006/0158945 discloses a readout circuit for a self-referenced memory cell array comprising several of MRAM cell. The readout operation on a selected MRAM cell comprises subsequently performing a first write with a first low (or high) resistance storage state, performing a first readout by measuring a first current, performing a second write with a second high (or low) resistance storage state, and performing a second readout by measuring a second current. The readout circuit comprises a preamplifier for converting the first current to an output voltage, voltage storage means for holding the output voltage, and voltage comparator means for comparing the output voltage from an output voltage from the comparator (second current). The above readout circuit requires performing sequentially the first write and readout and second write and readout, and is therefore time consuming. Compared to conventional MRAM cells, the self-referenced MRAM cell with two-cycle read operation requires a sensibly more complex reading circuit with controlled timing signals for the two read cycles.

In unpublished European patent application, No. 09290563, filed on Jul. 13, 2009 by the present applicant, a self-referenced MRAM cell is described, comprising a method of reading the logic state of the MRAM cell. The method comprises a write operation, where data is written into storage layer of the magnetic tunnel junction by switching the storage layer magnetization, and a two-cycle read operation. More particularly, during the first cycle of the read operation, the magnetization of the sense layer is aligned with a first read magnetic field and the corresponding first resistance value of the magnetic tunnel junction is stored. During the second cycle of the read operation, the magnetization of the sense layer is aligned with a second read magnetic field and the corresponding second resistance value of the magnetic tunnel junction is compared with the stored value of the first resistance value measured during the first read cycle. The logic state of the MRAM cell is determined from the sign, positive or negative, of the difference in the first and second resistance values.

Figure 1:
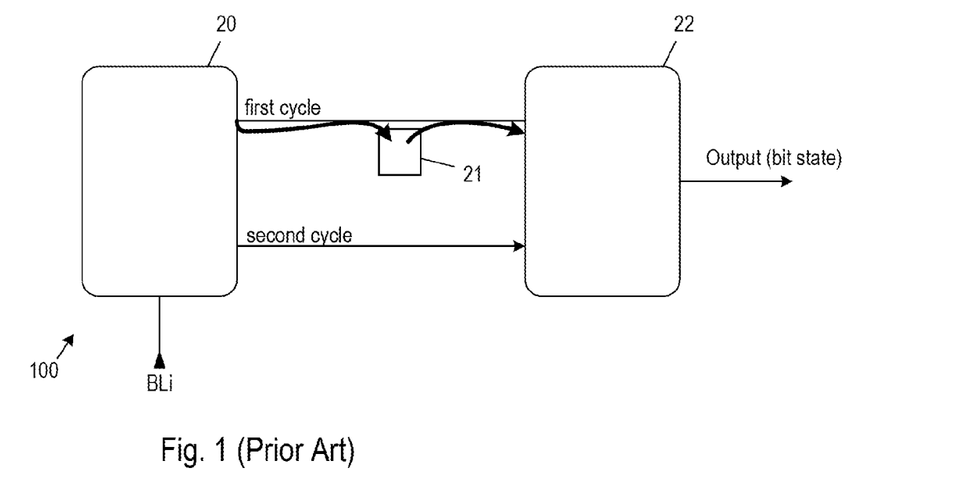
FIG. 1 shows a schematic representation of a conventional readout circuit.

FIG. 1 shows a schematic representation a conventional readout circuit 100 for performing the two-cycle read operation of the self-referenced MRAM cell described in European patent application No. 09290563. The conventional readout circuit 100 comprises a reading circuit 20 including a source transistor (not shown) capable of sourcing a sense current for measuring the first and second resistance value of the magnetic tunnel junction. The conventional readout circuit 100 also comprises a sample and hold circuit 21 using a capacitance (not shown) to store the first resistance value, and a comparator 22 for determining the logic state of the MRAM cell. The logic state can be amplified to a rail-to-rail signal.

The controllable readout circuit 100 does not allow for controlling the first and second readout timing after completion of the MRAM cell and readout circuit fabrication.

BRIEF SUMMARY OF THE INVENTION

The present disclosure concerns a self-reference sense amplifier circuit which overcomes at least some limitations of the prior art.

According to the embodiments, a controllable readout circuit, for performing a self-referenced read operation on a memory device comprising a plurality of magnetic random access memory (MRAM) cells, each MRAM cell having a first storage state with a first resistance value and second storage state with a second resistance value, can comprise a selecting device for selecting one of the MRAM cells; and a sense circuit adapted to source a sense current for measuring the first and second resistance value of the selected MRAM cell during a first and second read cycle, respectively; the sense circuit comprising a sample and hold circuit for storing said first resistance value, and a differential amplifier circuit for comparing said second resistance value to said stored first resistance value; wherein said controllable readout circuit can further comprise a control circuit adapted to provide a pulse-shaped timing signal having a pulse duration controlling the duration of the first read cycle and the second read cycle.

In an embodiment, the control circuit can comprises a timing capacitance; a constant current source adapted to provide a constant pull up current for charging the timing capacitance; a time control device adapted to provide a substantially constant time reference voltage; and a voltage comparator for comparing the voltage corresponding to the timing capacitance and the time reference voltage and outputting the timing signal; and wherein the pulse duration of the timing signal is determined by the charging speed of the timing capacitance and the value of the time reference voltage. The time control device can further comprise a PMOS transistor and an NMOS transistor. The voltage comparator can comprise an operational amplifier which is being inputted into a logic gate.

In another embodiment, the control circuit can further comprise an enabling device adapted to provide an enable signal during said self-referenced read operation, the enable signal activating the timing signal.

In yet another embodiment, the time control device can comprise a second resistance fuse circuit containing one or several fusible resistors for adjusting the value of the time reference voltage.

In yet another embodiment, the second resistance fuse circuit can contain four fusible resistors.

In yet another embodiment, the control circuit can further comprise a transistor fuse circuit formed from one or several PMOS transistors adapted to control the charging speed of the timing capacitance. The transistor fuse circuit can comprise two PMOS transistors.

In yet another embodiment, the control circuit can further comprise a reference voltage device adapted to provide a substantially constant reference voltage for controlling the magnitude of the sense current. The reference voltage device can further comprise a PMOS transistor and a NMOS transistor, and a reference capacitance connected to the drain of the PMOS transistor.

In yet another embodiment, the reference voltage device can comprise a first resistance fuse circuit containing one or several fusible resistors for adjusting the value of the reference voltage.

In yet another embodiment, the sense circuit can further comprise a switching circuit switchable on or off by the timing signal, during the first and second read cycle, respectively; such that when switching circuit is switched on, said storing said first resistance value can performed by storing a sense reference voltage in the sample and hold circuit, and when switching circuit is switched off, said comparing said second resistance value to the stored first resistance value can be performed in the differential amplifier circuit.

In yet another embodiment, the switching circuit can comprise a first and second equalizing pass gate circuit. The sample and hold circuit can be a sense reference capacitance.

In yet another embodiment, the controllable readout circuit can further comprise an address transition detector circuit adapted to provide an address transition detection signal having a high value when performing said selecting one of the MRAM cells.

The present disclosure also pertains to a memory device comprising a memory array including MRAM cells arranged in rows and columns, each MRAM cell having a first storage state with a first resistance value and a second storage state with a second resistance value; and the controllable readout circuit.

Also disclosed is a method for performing a self-referenced readout operation on the memory device using the controllable readout circuit and comprising:
    selecting one of the MRAM cells with the selecting device;
    during a first read cycle, measuring a first resistance value of the selected MRAM cell and storing the measured first resistance value in the sample and hold circuit;
    during a second read cycle, measuring a second resistance value of the selected MRAM cell and comparing said second resistance value to the stored first resistance value by the differential amplifier circuit; wherein
    said pulse-shaped timing signal has a pulse duration controlling the duration of the first and second read cycle.

The controllable readout circuit disclosed herein allows for controlling the duration of the first and second read cycles after completion of the MRAM cell and readout circuit fabrication.

BRIEF DESCRIPTION OF THE DRAWINGS

The disclosure will be better understood with the aid of the description of an embodiment given by way of example and illustrated by the figures, in which.

DETAILED DESCRIPTION OF POSSIBLE EMBODIMENTS

Figure 2:
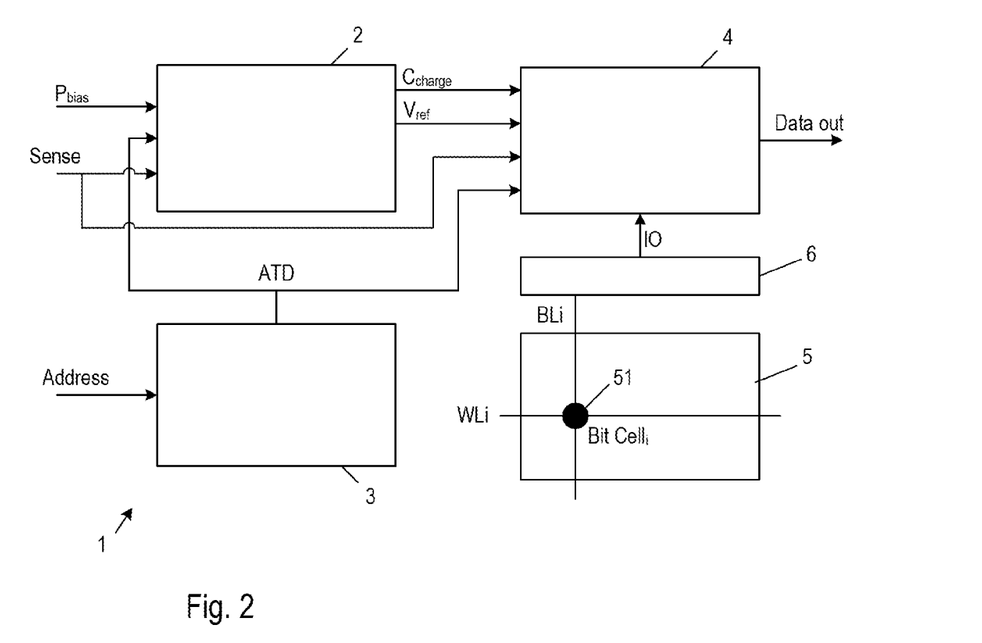
FIG. 2 represents schematically a controllable readout comprising a control circuit and a sense circuit, according to an embodiment.

A controllable readout circuit 1 according to an embodiment is represented schematically in FIG. 2. The controllable readout circuit 1 comprises a control circuit 2, an address transition detector circuit 3, and a sense circuit 4.

The controllable readout circuit 1 according to the embodiments is applied to a memory device represented by the numeral 5 in FIG. 2, and comprising several magnetic random access memory (MRAM) cells, for example, arranged into an array of rows and columns. Each MRAM cells in a row and in a column is connected to a corresponding word line and a bit line, respectively. In FIG. 2, one selected memory cell 51 is shown with its corresponding word line WLi and bit line BLi. The controllable readout circuit 1 further comprises a selecting device such as a multiplexer 6, for example of Y-MUX type, routing the selected bit lines BLi of the memory device to the main sense circuit 4.

In an embodiment not represented, each MRAM cell 51 comprises a magnetic tunnel junction formed of a reference layer having a magnetization which direction can be switched from a first stable direction to a second stable direction upon writing of the cell, a sense layer having a magnetization with a variable direction, and an insulating layer between the storage layer and the sense layer.

The controllable readout circuit 1 according to the embodiments is also applied to a self-referenced readout operation comprising:
    selecting a MRAM cell 51;
    performing a write operation of the selected MRAM cell 51, where a logic state data is written into the storage layer of the magnetic tunnel junction of the cell 51 by switching the storage layer magnetization; and
    performing a read operation of the selected MRAM cell 51, where
    during a first read cycle, the magnetization of the sense layer is aligned according to a first direction and the corresponding first resistance value of the magnetic tunnel junction is stored; and
    where during second read cycle, the magnetization of the sense layer is aligned according to a second direction and the corresponding second resistance value of the magnetic tunnel junction is compared with the stored value of the first resistance value measured during the first read cycle.

During the first and second read cycles, the magnetization of the sense layer can be aligned with a first and second read magnetic field, respectively. The first and second resistance value of the magnetic tunnel junction is measured by passing a sense current (represented by the symbol IO in FIG. 4) through the magnetic tunnel junction. The written logic state data of the MRAM cell is determined from the sign, positive or negative, of the difference in the measured first and second resistance values, or the corresponding first and second voltage values, respectively.

In other words, during the first read cycle, the selected magnetic tunnel junction, or the selected MRAM cell (51), has a first storage state, corresponding to a first stored resistance value, determined by the first direction of the sense layer magnetization relative to the magnetization direction of the storage layer and corresponding to the first resistance value. During the second read cycle the MRAM cell (51) has a second storage state, corresponding to a second stored resistance value, determined by the second direction of the sense layer magnetization relative to the magnetization direction of the storage layer and corresponding to the second resistance value.

Selecting a MRAM cell 51 is performed by the multiplexer 6 and corresponds to a change in an address status. The address transition detector circuit 3 acts as an address flag and detects the change in the address status generating a corresponding address transition detection pulse (ATD) signal with a high value. Performing the write operation generates a sense signal SENSE having low value, and performing the read operation generates a sense signal SENSE having high value.

Figure 3:
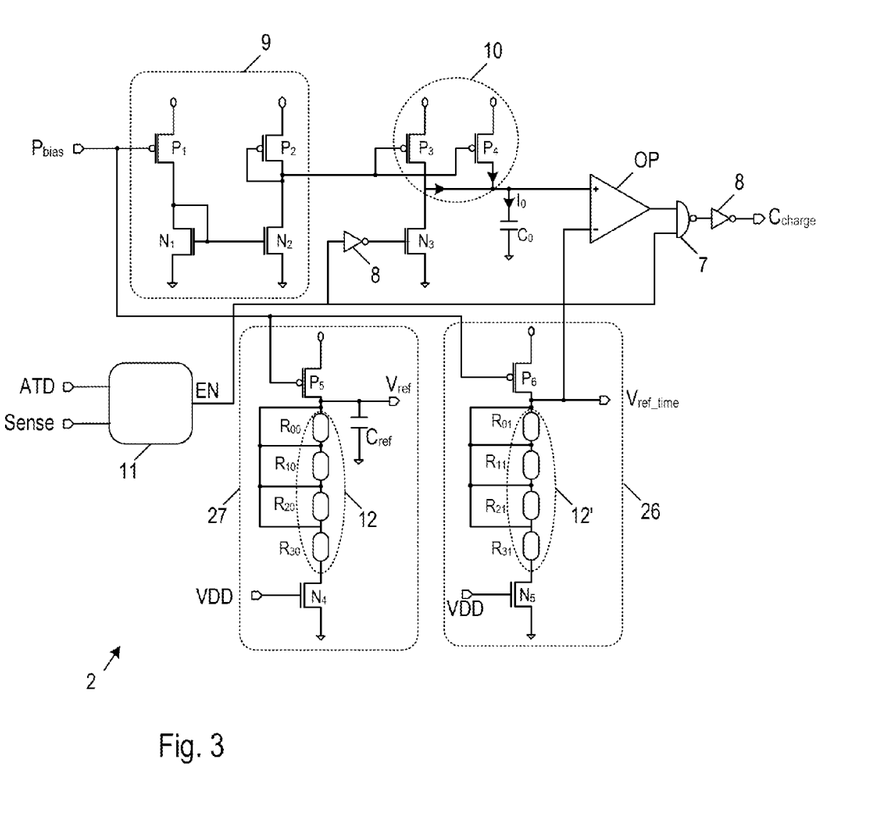
FIG. 3 illustrates the control circuit according to an embodiment.

The control circuit 2 is shown in details in FIG. 3, according to an embodiment. The control circuit 2 comprises a constant current source. Here, the constant current source is a current mirror circuit 9 formed from a pair of identical NMOS transistors $N_1$ and $N_2$ and a pair of identical PMOS transistors $P_1$ and $P_2$. Transistors $P_1$ and $N_1$ are connected in series by their source and drain, respectively, forming a first branch, while transistors $P_2$ and $N_2$ are connected in series by their source and drain, respectively, forming a second branch. Both sources of transistors $N_1$ and $N_2$ are connected to ground. When a bias voltage $P_{BIAS}$, originating from a conventional bandgap voltage reference circuit (not shown) is applied to the gate of transistor $P_1$, the transistor $P_1$ provides a constant pull up current $I_0$ for different values of $V_{DD}$ and temperatures.

The control circuit 2 further comprises an enabling device, here a digital selection circuit 11, into which the ATD signal and the sense signal SENSE are inputted. The digital selection circuit 11 is adapted to deliver an enable signal EN at its output, depending on the respective value of the ATD signal and on the sense signal SENSE. For example, the enable signal EN is activated when both ATD signal and sense signal SENSE have a high value, i.e., during the read operation of a selected MRAM cell 51. The digital selection circuit 11 can be formed from logic gates as described in U.S. Pat. No. 4,534,004 or any other suitable means. The output of the digital selection circuit 11 is connected to the gate of an NMOS transistor $N_3$ via an inverter 8. The source of transistor $N_3$ is connected to a timing capacitance $C_0$ that can be charged by the pull up current $I_0$ as will be described below.

The control circuit 2 further comprises a time control device 26. In the example of FIG. 3, the time control device includes a PMOS transistor $P_6$ and an NMOS transistor $N_5$, respectively connected to the bias voltage $P_{BIAS}$ and the voltage source $V_{DD}$. A time reference voltage $V_{ref\_time}$ is generated by a current (not shown) from transistor $P_6$. Since the gate of transistor $P_6$ is connected to bias voltage $P_{BIAS}$, the time reference voltage $V_{ref\_time}$ is constant for different values of the voltage source $V_{DD}$ and temperature.

In a variant of the embodiment, the control circuit 2 also comprises a reference voltage device 27 including a PMOS transistor $P_5$ and a NMOS transistor $N_4$, respectively connected to the bias voltage $P_{BIAS}$ and the voltage source $V_{DD}$. The reference voltage device 27 also includes a reference capacitance $C_{ref}$ connected to the drain of transistor $P_5$. A reference voltage $V_{ref}$ is generated by a current (not shown) from transistor $P_5$. Since the gate of transistor $P_5$ is connected to bias voltage $P_{BIAS}$, the reference voltage $V_{ref}$ is constant for different values of the voltage source $V_{DD}$, and temperature.

In an embodiment, the reference voltage device 27 comprises a first resistance fuse circuit 12 including one or several fusible resistors connected in series between the transistors $P_5$ and $N_4$. In the example of FIG. 3, the first resistance fuse circuit 12 includes four fusible resistors $R_{00}$, $R_{10}$, $R_{20}$ and $R_{30}$.

In another embodiment, the time control device 26 comprises a second resistance fuse circuit 12' including one or several fusible resistors connected in series between the transistors $P_6$ and $N_5$. In the example of FIG. 3, the second resistance fuse circuit 12' includes four fusible resistors $R_{01}$, $R_{11}$, $R_{21}$ and $R_{31}$.

In yet another embodiment, the control circuit 2 comprises a programmable transistor fuse circuit 10 formed from two PMOS transistors $P_3$ and $P_4$ having their respective gates connected to the drain voltage of transistor $P_2$ of the current mirror circuit 9, and their respective drains connected to the timing capacitance $C_0$. The transistor fuse circuit 10 thus provides the constant pull up current $I_0$ for different values of $V_{DD}$ and temperatures, to charge the timing capacitance $C_0$. The drain of transistor $P_3$ is connected to the source of transistor $N_3$ and the timing capacitance $C_0$.

The timing capacitance $C_0$ and the drain of transistor $P_6$ are connected respectively to voltage comparator adapted to compare the voltage corresponding to the timing capacitance $C_0$ and the voltage at the transistor $P_6$. In the example of FIG. 3, the voltage comparator is an operational amplifier OP and the timing capacitance $C_0$ and the drain of transistor $P_6$ are respectively connected to the non-inverting and inverting input of the operational amplifier OP.

In the embodiment, shown in FIG. 3, the output of the operational amplifier OP and the output of the digital selection circuit 11 are connected to a logic gate 7, the output of the logic gate 7 comprising an inverter 8, forming the output of the control circuit 2.

During the first read cycle, the ATD signal and the SENSE signal are high and the enable signal EN is activated. The enable signal EN turns off the transistor $N_3$ allowing for the pull up current $I_0$ to flow from transistor $P_3$ and $P_4$ of the transistor fuse circuit 10 through the timing capacitance $C_0$ and start charging the latter. Here, the operational amplifier OP is used as a voltage comparator. Once the timing capacitance $C_0$ has been charged such that the value of the voltage at the operational amplifier non-inverting input becomes greater than the value of the time reference voltage $V_{ref\_time}$, the output voltage, or timing signal, $C_{charge}$ of the operational amplifier OP switches its polarity. The timing signal, $C_{charge}$ is then said active when the enable signal EN is activated. The switching polarity of the timing signal, $C_{charge}$ corresponds to the start of the second read cycle, as discussed below. Consequently, the timing signal, $C_{charge}$ generated by the output of the control circuit 2 is a pulse-shaped signal having a first polarity during the first read cycle and a second inversed polarity during the second read cycle. The pulse duration of the timing signal $C_{charge}$ is determined by the change in polarity of the timing signal $C_{charge}$, and then varies with the charging speed of the timing capacitance $C_0$ and the value of the time reference voltage $V_{ref\_time}$. Since both the pull up current $I_0$ charging the timing capacitance $C_0$ is constant and the time reference voltage $V_{ref\_time}$ are constant with varying voltage source $V_{DD}$ and temperature values, the timing signal $C_{charge}$ is also constant for different voltage source $V_{DD}$ and temperature values.

The speed of charging the timing capacitance $C_0$ can be controlled by adjusting the pull up current $I_0$ or the voltage across the timing capacitance $C_0$. This can be performed by modifying the number of transistors $P_3$ and $P_4$ used in the transistor fuse circuit 10. In the example of FIG. 3, the two transistors $P_3$ and $P_4$ are used and set a charging speed of timing capacitance $C_0$. However, the transistor fuse circuit 10 can comprise less or more transistors than the transistors $P_3$ and $P_4$ shown in FIG. 3 in order to modify the charging speed of timing capacitance $C_0$. For example, the transistor fuse circuit 10 can comprises several transistors $P_3$ and $P_4$ where the number of transistor being active and affecting the charging speed of timing capacitance $C_0$ is varied by shunting one or several transistors or connecting them in the circuit 10.

Alternatively, the pulse duration of the timing signal $C_{charge}$ can be controlled by adjusting the time reference voltage $V_{ref\_time}$ using the second resistance fuse circuit 12'. In the example of FIG. 3, the resistors $R_{01}$ to $R_{21}$ are shorted and the time reference voltage $V_{ref\_time}$ is determined solely by the value of resistor $R_{31}$. The value of the time reference voltage $V_{ref\_time}$ can be changed by adding one or several of the resistors from $R_{01}$ to $R_{21}$ in the circuit 12'. The second resistance fuse circuit 12' can also comprises a lesser or greater number of resistors than the four resistors $R_{01}$ to $R_{31}$ shown in FIG. 3.

The first resistance fuse circuit 12 is used for adjusting the reference voltage $V_{ref}$. As shown in the example of FIG. 3, the reference voltage $V_{ref}$ is determined solely by the value of fusible resistor $R_{30}$. The resistors $R_{01}$ to $R_{21}$ can however be added in the circuit 12', or shunted, in order to modify the value of the reference voltage $V_{ref}$. Again, the first resistance fuse circuit 12 can also comprises a lesser or greater number of resistors than the four resistors $R_{00}$ to $R_{30}$ shown in the example of FIG. 3.

Using the transistor fuse circuit 10 and/or the first and second resistance fuse circuits 12, 12' allow for respectively controlling the timing signal $C_{charge}$, the time reference voltage $V_{ref\_time}$ and/or reference voltage $V_{ref}$ after manufacturing the controllable readout circuit 1, for example, during a testing phase. The timing signal, $C_{charge}$ can then be used as an adjustable timing sense control for the main sense circuit 4.

In an embodiment not represented, the transistor fuse circuit 10 and second resistance fuse circuit 12' are used with an internal register chain to provide a default operation set comprising several timing signals $C_{charge}$. Since the transistor and second resistance fuse circuits 10, 12' can be altered post-production, the several timing signals $C_{charge}$ are expected to be adapted across processing and operating variations.

Figure 4:
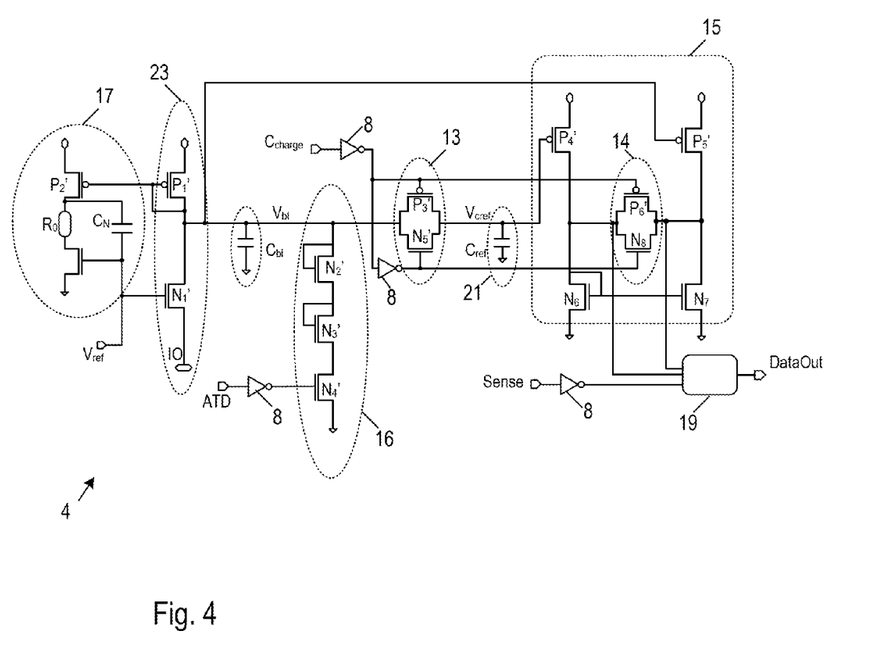
FIG. 4 shows the sense circuit according to an embodiment.

The sense circuit 4 is illustrated in FIG. 4 according to an embodiment. The sense circuit 4 comprises a pre-sense amplifier circuit 15 including a first branch formed from PMOS and NMOS transistors $P_4'$ and $N_6$, respectively and a second branch formed from PMOS and NMOS transistors $P_5'$ and $N_7$ respectively. The sense circuit 4 also comprises a switching circuit formed from a first equalizing pass gate circuit 13, comprising a PMOS transistor $P_3'$ and a NMOS transistor $N_5'$, and a second equalizing pass gate circuit 14, comprising a PMOS transistor $P_6'$ and a NMOS transistor $N_8$. The first and second equalizing pass gate circuits 13, 14 are connected in parallel through the gates of their respective transistors. The second equalizing pass gate circuit 14 is connected between the first branch, at drains and sources of the transistors $P_4'$, $N_6$, and the second branch, at drains and sources of the transistors $P_5'$ and $N_7$.

As shown in FIG. 4, the output of the control circuit 2 generating the timing signal $C_{charge}$ is connected at the gates of the two equalizing pass gate circuit 13, 14, via an inverter 8. Another inverter 8 is also present on the branch connecting the gate of transistors $N_5'$ and $N_8$ of the first and second equalizing pass gate circuit 13, 14, respectively. A sample and hold circuit sense 21 comprising a sense reference capacitance $C_{cref}$ is connected between the drain of transistor $N_5'$ of first equalizing pass gate circuit 13 and the gate of transistor $P_4'$ of the pre-sense amplifier circuit 15.

The sense circuit 4 further comprises a current mirror circuit 23 including a PMOS transistor $P_1'$ and NMOS transistor $N_1'$, the drain of transistor $P_1'$ being connected to the selected bit line BLi. The current mirror circuit 23 is adapted to source the sense current IO flowing in the magnetic tunnel junction, via the bit line BLi, and used to measure the first and second resistance value of the magnetic tunnel junction. The bit line voltage corresponding to the first and second resistance value of the magnetic tunnel junction measured with the sense current IO is reported in FIG. 4 by the symbol $V_{BL}$. The bit line capacitance introduced in the sense circuit 4 is also represented in FIG. 4 by the symbol $C_{BL}$. The drain of transistor $P_1'$ is connected to the first equalizing pass gate circuit 13 and to the gate of transistor $P_5'$ of the pre-sense amplifier circuit 15.

A differential amplifier circuit 19, formed from a differential amplifier (not shown) and a level shifter (also not shown), is connected to the drain and source of transistors $P_6'$ and $N_8$ of the second equalizing pass gate circuit 14. In this configuration, both the bit line voltage $V_{BL}$ and a sense reference voltage $V_{cref}$ corresponding to the sense reference capacitance $C_{cref}$, are inputted into the sense amplifier circuit 19. The sense signal SENSE is also inputted into the sense amplifier circuit 19.

In an embodiment, the sense circuit 4 further comprises a clamp circuit 16 including three NMOS transistors $N_2'$, $N_3'$, $N_4'$, and connected to the drain of transistor $P_1'$. The exemplary circuit of FIG. 4 also includes the ATD signal being inputted to the gate of transistor $N_4'$, via an inverter 8.

In another embodiment, the sense circuit 4 further comprises a noise compensation circuit 17 including a PMOS transistor $P_2'$, a NMOS transistor $N_0$, a noise circuit capacitance $C_N$, and a resistor $R_0$.

In the configuration of the sense circuit 4 described above, the timing signal $C_{charge}$ switches the switching circuit on or off, depending if the active timing signal $C_{charge}$ has the first or second polarity, respectively. More particularly, when the first and second equalizing pass gate circuits 13, 14 are switched on, during the first read cycle, the sense reference capacitance $C_{cref}$ is connected to the bit line BLi allowing the sense current IO to flow in the sense reference capacitance $C_{cref}$, charging or discharging it in order to store the sense reference voltage $V_{cref}$ corresponding to first resistance value. When the first and second equalizing pass gate circuits 13, 14 are switched off, during the second read cycle, the sense reference capacitance $C_{cref}$ is disconnected from the bit line BLi and held at its charged (or discharged) value acquired during the first read cycle. The sense reference voltage $V_{cref}$, corresponding to the charged (or discharged) sense reference capacitance $C_{cref}$ is then compared in the differential sense amplifier circuit 19 with the bit line voltage $V_{BL}$ which value corresponds to the sense current IO flowing in the bit line BLi during the second read cycle, thus to the second resistance value. The differential sense amplifier circuit 19 is enabled by the sense signal SENSE since the sense signal is high during the read operation. The difference between the compared sense reference voltage $V_{cref}$ and bit line voltage $V_{BL}$ values is then amplified by the differential sense amplifier circuit 19 in order to output a high ($V_{DD}$) or low (0) rail to rail signal.

When the timing signal $C_{charge}$ is active and during the first read cycle, the first equalizing pass gate circuit 13 being switched on equalizes the sense reference voltage $V_{cref}$ and the bit line voltage $V_{BL}$ nodes. The second equalizing pass gate circuit 14, being also switched on, equalizes the voltages at the first and second differential nodes 24 and 25 (see FIG. 4) of the first and second branch of the pre-sense amplifier circuit 15, respectively. Equalizing the sense reference voltage $V_{cref}$ and the bit line voltage $V_{BL}$ nodes and the two differential nodes 24 and 25 allows for speed up overall read operation since, during the second read cycle, only a small difference between the sense reference voltage $V_{cref}$ and the bit line voltage $V_{BL}$ needs to be detected by the differential sense amplifier circuit 19. Consequently, matching the sense reference capacitance $C_{cref}$ with the bit line capacitance $C_{BL}$, allows for fast read operation.

The clamp circuit 16 allows for pulling down the bit line voltage $V_{BL}$, when the ATD signal has a low value, for example, during the write operation. Indeed, when the ATD signal is high a low value is inputted to the gate of the transistor $N_4'$, due to inverter 8, and a discharging current can flow through the clamp circuit 16, discharging the bit line BLi and the sense reference capacitance $C_{cref}$. The maximum pull down of the bit line voltage $V_{BL}$, is about 1.4V. The bit line voltage $V_{BL}$, typically operates between 0.8V to 1.3V depending on the resistance-area product RA of the magnetic tunnel junction and the voltage source $V_{DD}$. Since the discharging current does not flow through the magnetic tunnel junction itself, the discharging current can be large and of the bit line BLi can be discharged very fast, for example, a few nanoseconds. Moreover, since the discharging happens during the write operation, the read operation itself is not slowed down by the discharging. Pulling down the bit line voltage $V_{BL}$, also allows for equalizing faster the bit line voltage $V_{BL}$, node with the sense reference voltage $V_{cref}$ node. When the ATD signal has a high value, for example, during the read operation, no current can through the clamp circuit 16. The bit line voltage $V_{BL}$, and sense reference capacitance $C_{cref}$ are not affected.

The reference voltage $V_{ref}$, generated from the reference voltage device 27 of the control circuit 2 can be used to control the bit line voltage $V_{BL}$, and, consequently, the magnitude of the sense current IO. For example, the reference voltage $V_{ref}$ can have a value of about 1.1V and can be used to limit the bit line voltage $V_{BL}$, to a value of about 0.35V when the timing signal $C_{charge}$ is active. As discussed above, the reference voltage $V_{ref}$, thus the bit line voltage $V_{BL}$, can be adjusted by resistance fuse circuit 12.

Increasing the value of the reference voltage $V_{ref}$ will increase the magnitude of the sense current IO and the charging speed of the sense reference capacitance $C_{cref}$. Increasing the charging speed of the sense reference capacitance $C_{cref}$ allows for reducing the pulse time of the timing signal $C_{charge}$, thus the charging time of the timing capacitance $C_0$, for example, by adjusting the time reference voltage $V_{ref\_time}$ using the second resistance fuse circuit 12'. Here, the sense reference capacitance $C_{cref}$ needs not be completely charged after the first read cycle since. Indeed, during the second read cycle, the sense reference voltage $V_{cref}$ is compared with the bit line voltage $V_{BL}$, for a charging time of the bit line capacitance $C_{BL}$, that is equivalent to the charging time of the reference capacitance $C_{cref}$ during the first read cycle.

The noise compensation circuit 17 eliminates possible capacitive coupling noise on the sense reference voltage $V_{cref}$ when the timing signal $C_{charge}$ is active. Such noise can be caused by glitches on the bit line voltage $V_{BL}$, or the sense current IO, causing the sense reference voltage $V_{cref}$ to become coupled by the transistor $N_1$, resulting in the transistor $P_1$ responding with a lower or higher current during high or low values of the voltage glitches, respectively. Using the noise compensation circuit 17, transistor $P_2$ mirrors transistor $P_1$ and the current on transistor $P_2$ tracks with the one on transistor $P_1$. The current on transistor $P_2$ goes lower and the noise circuit capacitance $C_N$ and transistor $N_0$ compensate for transistor $N_1$ coupling, resulting in the substantially stable reference voltage $V_{ref}$.

Reference Numbers and Symbols

1 controllable readout circuit
2 control circuit
3 address transition detector circuit
4 sense circuit
5 memory cell array
51 selected memory cell
6 multiplexer
7 logic gate
8 inverter
9 current mirror circuit
10 transistor fuse circuit
11 digital selection circuit
12 first resistance fuse circuit
12' second resistance fuse circuit
13 first equalizing pass gate circuit
14 second equalizing pass gate circuit
15 pre-sense amplifier circuit
16 clamp circuit
17 noise compensation circuit
19 differential sense amplifier circuit
20 reading circuit
21 sample and hold circuit
22 comparator
23 current mirror circuit
24 first differential node
25 second differential node
26 time control device
27 reference voltage device
ATD address transition detection pulse
BLi selected bit line
$C_{BL}$, bit line capacitance
$C_0$ timing capacitance
$C_{charge}$ timing signal
$C_{cref}$ sense reference capacitance
$C_N$ noise circuit capacitance
$C_{ref}$ reference capacitance
EN enable signal
$I_0$ pull up current
IO sense current
$N_0$ to $N_8$ NMOS transistor
$N_1'$ to $N_5'$ NMOS transistor
$P_1$ to $P_6$ PMOS transistor
$P_1'$ to $P_6'$ PMOS transistor
$P_{BIAS}$ bias voltage
OP operational amplifier
$R_0$. resistor
$R_{00}$ to $R_{30}$ fusible resistors
$R_{01}$ to $R_{31}$ fusible resistors RA resistance-area product of the magnetic tunnel junction
SENSE sense signal
$V_{BL}$ bit line voltage
$V_{cref}$ sense reference voltage
$V_{DD}$ voltage source
$V_{DM}$ drain voltage of transistor $P_2$
$V_{ref}$ reference voltage
$V_{ref\_time}$ time reference voltage
WLi word line

The invention claimed is:

1. Controllable readout circuit for performing a self-referenced read operation on a memory device comprising a plurality of magnetic random access memory (MRAM) cells, each MRAM cell having a first storage state with a first resistance value and second storage state with a second resistance value, said controllable readout circuit comprising:
a selecting device for selecting one of the MRAM cells; and
a sense circuit adapted to source a sense current for measuring the first and second resistance value of the selected MRAM cell during a first and second read cycle, respectively; the sense circuit comprising a sample and hold circuit for storing said first resistance value, and a differential amplifier circuit for comparing said second resistance value to said stored first resistance value; wherein
said controllable readout circuit further comprises a control circuit adapted to provide a pulse-shaped timing signal having a pulse duration controlling the duration of the first read cycle and the second read cyclesuch that said pulse duration of said pulse-shaped timing signal is adjustable, and wherein
said controllable readout ciruit further comprising a timing capacitance, a constant current source adapted to provide a constant pull up current for charging the timing capacitance, a time control device generating a time reference voltage, and a voltage comparator for comparing the voltage corresponding to the timing capacitance and the time reference voltage and outputting the timing signal; and wherein
the pulse duration of the pulse-shaped timing signal being determined by the charging speed of the timing capacitance and the value of the time reference voltage.

2. The controllable readout circuit according to claim 1, wherein
the time control device comprises a second resistance fuse circuit containing one or several fusible resistors for adjusting the value of the time reference voltage.

3. The controllable readout circuit according to claim 2, wherein
the second resistance fuse circuit contains four fusible resistors.

4. The controllable readout circuit according to claim 1, wherein
the control circuit further comprises a transistor fuse circuit formed from one or several PMOS transistors adapted to control the charging speed of the timing capacitance.

5. The controllable readout circuit according to claim 1, wherein
the control circuit further comprises an enabling device adapted to provide an enable signal during said self-referenced read operation, the enable signal activating the timing signal.

6. The controllable readout circuit according to claim 1, wherein the control circuit further comprises a reference voltage device adapted to provide a substantially constant reference voltage for controlling the magnitude of the sense current.

7. The controllable readout circuit according to claim 6, wherein
the reference voltage device comprises a first resistance fuse circuit containing one or several fusible resistors for adjusting the value of the reference voltage.

8. The controllable readout circuit according to claim 1, wherein
the sense circuit further comprises a switching circuit switchable on or off by the timing signal, during the first and second read cycle, respectively, such that when switching circuit is switched on, said storing said first resistance value can performed by storing a sense reference voltage in the sample and hold circuit, and when switching circuit is switched off, said comparing said second resistance value to the stored first resistance value can be performed in the differential amplifier circuit.

9. The controllable readout circuit according to claim 1, wherein the sample and hold circuit is a sense reference capacitance.

10. The controllable readout circuit according to claim 1, wherein
the controllable readout circuit further comprises an address transition detector circuit adapted to provide an address transition detection signal having a high value when performing said selecting one of the MRAM cells.

11. The controllable readout circuit according to claim 1, wherein the control circuit is further adapted for controlling the timing signal after manufacturing the controllable readout circuit; and
wherein said control circuit comprises a reference time device providing a time reference voltage, the reference time device comprising a second resistance fuse circuit including one or several fusible resistors; and
said controlling the timing signal comprises adjusting the time reference voltage using the second resistance fuse circuit.

12. The controllable readout circuit according to claim 1, wherein said control circuit further comprises a reference voltage device providing a substantially constant reference voltage, the reference voltage device comprising a first fuse circuit including one or several fusible resistors; and
said controlling the timing signal comprises adjusting the reference voltage.

13. The controllable readout circuit according to the claim 1, wherein the control circuit further comprises a timing capacitance and a transistor fuse circuit formed from one or several PMOS transistors, the transistor fuse circuit being adapted to control the charging speed of the timing capacitance such as to control the pulse-shaped timing signal.

14. A memory device comprising:
a memory array including magnetic random access memory (MRAM) cells arranged in rows and columns, each MRAM cell having a first storage state with a first resistance value and a second storage state with a second resistance value; and
a controllable readout circuit for performing a self-referenced read operation on the memory array and comprising a selecting device for selecting one of the MRAM cells; and a sense circuit adapted to source a sense current for measuring the first and second resistance value of the selected MRAM cell during a first and second read cycle, respectively; the sense circuit comprising a sample and hold circuit for storing said first resistance value, and a differential amplifier circuit for comparing said second resistance value to said stored first resistance value, wherein said controllable readout circuit further comprises a control circuit adapted to provide a pulse-shaped timing signal having a pulse duration controlling the duration of the first read cycle and the second read cycle such that the pulse duration of said pulse-shaped timing signal is adjustable, and wherein the control circuit comprises a timing capacitance; a constant current source adapted to provide a constant pull up current for charging the timing capacitance; a time control device adapted to provide a substantially constant time reference voltage; and a voltage comparator (OP) for comparing the voltage corresponding to the timing capacitance and the time reference voltage and outputting the timing signal; and wherein the pulse duration of the timing signal is determined by the charging speed of the timing capacitance and the value of the time reference voltage.

15. A method for performing a self-referenced readout operation on a memory array comprising a plurality of magnetic random access memory (MRAM) cells, using a controllable readout circuit comprising a selecting device and a sense circuit including a sample and hold circuit and a differential amplifier circuit; said controllable readout circuit further comprising a control circuit comprising a timing capacitance being charged by a pull up current provide by a current constant current source, a time control device adapted to provide a substantially constant time reference voltage; and a voltage comparator for comparing the voltage corresponding to the timing capacitance and the time reference voltage and outputting a pulse-shaped timing signal; the method comprising:

selecting a MRAM cell with the selecting device;
during a first read cycle, measuring a first resistance value of the selected MRAM cell and storing the measured first resistance value in the sample and hold circuit;
during a second read cycle, measuring a second resistance value of the selected MRAM cell and comparing said second resistance value to the stored first resistance value by the differential amplifier circuit; wherein
said pulse-shaped timing signal has a pulse duration controlling the duration of the first and second read cycle, the pulse duration of the pulse-shaped timing signal being adjustable.

16. The method according to claim 15, wherein
said measuring first and second resistance value comprises sourcing a sense current with the sense circuit and passing the sense current in the selected MRAM cell.

17. The method according to claim 15, wherein
the sense circuit further comprises a switching circuit switchable on or off by the timing signal, and the hold circuit sense comprises a sense reference capacitance having a corresponding sense reference voltage; and wherein
said storing the measured first resistance value comprises switching on the switching circuit for storing the sense reference voltage in the sample and hold circuit.

18. The method according to claim 15, wherein
said comparing said second resistance value to the stored first resistance value includes inputting the sense reference voltage into the sense amplifier circuit.

19. Controllable readout circuit for performing a self-referenced read operation on a memory device comprising a plurality of magnetic random access memory (MRAM) cells, each MRAM cell having a first storage state with a first resistance value and second storage state with a second resistance value, said controllable readout circuit comprising:

a selecting device for selecting one of the MRAM cells; and
a sense circuit adapted to source a sense current for measuring the first and second resistance value of the selected MRAM cell during a first and second read cycle, respectively; the sense circuit comprising a sample and hold circuit for storing said first resistance value, and a differential amplifier circuit for comparing said second resistance value to said stored first resistance value, wherein
said controllable readout circuit further comprises a control circuit adapted to provide a pulse-shaped timing signal having a pulse duration controlling the duration of the first read cycle and the second read cycle such that said pulse duration of said pulse-shaped timing signal is adjustable, and wherein
said control circuit further comprises a reference voltage device providing a substantially constant reference voltage, the reference voltage device comprising a first fuse circuit including one or several fusible resistors; and
said controlling the timing signal comprises adjusting the reference voltage.

20. The controllable readout circuit according to claim 19, wherein
the reference voltage device comprises a first resistance fuse circuit containing one or several fusible resistors for adjusting the value of the reference voltage.

21. Controllable readout circuit for performing a self-referenced read operation on a memory device comprising a plurality of magnetic random access memory (MRAM) cells, each MRAM cell having a first storage state with a first resistance value and second storage state with a second resistance value, said controllable readout circuit comprising:

a selecting device for selecting one of the MRAM cells; and
a sense circuit adapted to source a sense current for measuring the first and second resistance value of the selected MRAM cell during a first and second read cycle, respectively; the sense circuit comprising a sample and hold circuit for storing said first resistance value, and a differential amplifier circuit for comparing said second resistance value to said stored first resistance value, wherein
said controllable readout circuit further comprises a control circuit adapted to provide a pulse-shaped timing signal having a pulse duration controlling the duration of the first read cycle and the second read cycle such that said pulse duration of said pulse-shaped timing signal is adjustable, and wherein
said control circuit further comprises a reference voltage device providing a substantially constant reference voltage, the reference voltage device comprising a first fuse circuit including one or several fusible resistors, and said controlling the timing signal comprises adjusting the reference voltage.

* * * * *